United States Patent
Shelby

(10) Patent No.: US 7,602,108 B2
(45) Date of Patent: Oct. 13, 2009

(54) MICRO-COEXTRUDED FILM MODIFIED WITH PIEZOELECTRIC LAYERS

(75) Inventor: Marcus David Shelby, Kingsport, TN (US)

(73) Assignee: Eastman Chemical Company, Kingsport, TN (US)

( * ) Notice: Subject to any disclaimer, the term of this patent is extended or adjusted under 35 U.S.C. 154(b) by 168 days.

(21) Appl. No.: 11/412,451

(22) Filed: Apr. 27, 2006

(65) Prior Publication Data

US 2006/0267459 A1    Nov. 30, 2006

Related U.S. Application Data

(60) Provisional application No. 60/684,767, filed on May 26, 2005.

(51) Int. Cl.
*H01L 41/09* (2006.01)
(52) U.S. Cl. .................. 310/363; 310/311; 310/800
(58) Field of Classification Search ............... 310/311, 310/322, 334, 328, 800
See application file for complete search history.

(56) References Cited

U.S. PATENT DOCUMENTS

| | | |
|---|---|---|
| 3,557,265 A | 1/1971 | Chisholm et al. |
| 3,759,647 A | 9/1973 | Schrenk et al. |
| 3,773,882 A | 11/1973 | Schrenk |
| 3,884,606 A | 5/1975 | Schrenk |
| 4,405,402 A | 9/1983 | Quilliam |
| 4,627,138 A | 12/1986 | Im |
| 4,937,134 A | 6/1990 | Schrenk et al. |
| 5,103,337 A | 4/1992 | Schrenk et al. |
| 5,122,905 A | 6/1992 | Wheatley et al. |
| 5,122,906 A | 6/1992 | Wheatley |
| 5,126,880 A | 6/1992 | Wheatley et al. |
| 5,272,332 A | 12/1993 | Ning |
| RE34,605 E | 5/1994 | Schrenk et al. |
| 5,448,404 A | 9/1995 | Schrenk et al. |
| 5,540,978 A | 7/1996 | Schrenk |
| 5,568,316 A | 10/1996 | Schrenk et al. |
| 6,055,090 A | 4/2000 | Miles |
| 6,549,247 B2 | 4/2003 | Toda |
| 6,663,795 B2 | 12/2003 | Shimoshikiryo et al. |

(Continued)

FOREIGN PATENT DOCUMENTS

GB    2229855 A    3/1990

(Continued)

OTHER PUBLICATIONS

Database WPI, Section PQ, Week 199818, Derwent Publications Ltd., London, GB; Class P81, AN 1998-197518, XP002397515 & JP 10 048675 A (Sony Corp.), Feb. 20, 1998 abstract.

(Continued)

*Primary Examiner*—Mark Budd
(74) *Attorney, Agent, or Firm*—Louis N. Moreno; Bernard J. Graves, Jr.

(57) ABSTRACT

Disclosed are layered films having a combination of piezoelectric layers that change dimension with applied voltage and non-piezoelectric layers. The layered structures can form a wide range of electrically switchable optical films. These films have applications in displays, polarizers, optical compensators, aesthetic films, and "hot" and "cold" mirrors that selectively reflect only certain wavelengths. Also disclosed are monochromatic and multicolor displays using these films.

11 Claims, 5 Drawing Sheets

U.S. PATENT DOCUMENTS 6,791,644 B2   9/2004   Toda
6,827,886 B2   12/2004  Neavin et al.

FOREIGN PATENT DOCUMENTS

GB   2232498 A   12/1990

OTHER PUBLICATIONS

*Handbook of Optics*, Chapter 42 of vol. 1, Michael Bass, Ed., McGraw-Hill, New York, pp. 42.10 to 42.14.
*Ferroelectric Polymers*, T.T Wang, J.M. Herbert, and A.M. Glass, eds., Chapman and Hall, NY (1988) (Chapter 2).
*Ferroelectric Polymers*, T.T Wang, J.M. Herbert, and A.M. Glass, eds., Chapman and Hall, NY (1988) (Chapter 4).
*Ferroelectric Polymers*, T.T Wang, J.M. Herbert, and A.M. Glass, eds., Chapman and Hall, NY (1988) (Chapter 5).
*Ferroelectric Polymers*, T.T Wang, J.M. Herbert, and A.M. Glass, eds., Chapman and Hall, NY (1988) (Chapter 12).
The Mineral Cassiterite, Copy right 1995-2009 by Amethyst Galleries, pp. 1-2, [retrieved from the internet on Feb. 16, 2009] http://www.galleries.com/minerals/oxides/cassiter/cassiter.htm.
Ito, Tin-Doped Indium Oxide for Optical Coating, Cerao Inc., pp. 1-3, [retrieved from the internet on Feb. 16, 2009] http://www.cerac.com/pubs/proddata/ito.htm.
Transparent Multiphasic Polystyrene/Epoxy Blends, C.E. Hoppe et al., Polymer Engineering and Science, Dec. 2002, vol. 42, No. 12.

MICRO-COEXTRUDED FILM MODIFIED WITH PIEZOELECTRIC LAYERS

CROSS-REFERENCE TO RELATED APPLICATION

This application claims the benefit of the filing date of U.S. Provisional Patent Application No. 60/684,767, filed May 26, 2005; the entire content of which is hereby incorporated by reference.

FIELD OF THE INVENTION

This invention generally pertains to a multilayer film, having about 5 or more total layers and having at least 3 piezoelectric layers, in which the reflectivity and other optical properties of the film can be dynamically changed via application of an electrical field. The piezoelectric layers are preferably polymeric in nature and separated by intervening non-piezoelectric layers.

BACKGROUND OF THE INVENTION

Microcoextruded and other light control or "iridescent" films have found a wide range of applications including aesthetic/multi-color packaging, brightness enhancing and reflective films for liquid crystal display (LCD) applications, dielectric polarizers, compensating films, mirrors (including "cold" or "hot" mirrors for allowing visible light to transmit but not infrared, or vice-versa), etc. These films are typically made by coextruding many thin layers of different polymers, and can then be used as is, or laminated/coated for various applications. For these iridescent films to work properly, the different layers typically have different refractive indices, sometimes referred to in the literature as "mismatched" refractive indices, so as to optimize reflections at each interface. It is also advantageous that the thickness of each layer be on the order of the wavelength of light or smaller (i.e., less than a few microns) so as to maximize destructive interference upon reflection. Manipulation of the actual thicknesses, layer rearrangements, refractive indices, etc., allows one to tailor reflectivity and/or optical retardation as a function of wavelength, polarization, viewing angle, and so forth. These different combinations, in turn, provide widely varying light control for the different applications described above.

A typical micro-coextruded structure, for example, might be a film containing alternating layers of a polyester (e.g., polyethylene terephthalate (PET) or polyethylene naphthalate (PEN)) and poly(methyl methacrylate) (PMMA). The polyester has a fairly high refractive index (n>1.57) and a high birefringence, typically greater than about 0.05, upon orientation. In contrast, the PMMA has a very low refractive index (n is typically less than or equal to 1.50) and very little orientation induced birefringence, thus maximizing the reflectance. The total structure might contain 50 to 100 total layers of these alternating films, which are created by a special coextrusion feedblock. Typically, the film is oriented uniaxially or biaxially, to reduce the coextruded film into the desired thickness range, and also so as to induce birefringence for applications like polarizers. Iridescent films can be made from a wide variety of polymers, not just polyester/PMMA, the only requirement being that the films have appropriate refractive indices and thicknesses for the given application. Processing issues also can play a role in the selection because processing temperatures, coextrudability, adhesion, stretching behavior, and so forth, of the polymers should generally be compatible.

One of the shortcomings of previous iridescent structures and films is their "static", non-changeable optical properties. That is, once made, the films cannot have their reflectivity easily varied. In contrast, if the film's reflectivity could be easily changed via, for example, an applied voltage, which is the basis for the present invention, the resulting applications would be enormous. This voltage varying optical structure may be referred to as a "dynamic" light control film or an "optical modulating" film. As an example, with the appropriately applied electrodes, the film could act as a type of display element. Application of a voltage would cause the dynamic film to switch from transmission to reflection, or vice-versa, in much the same way a liquid crystal display film (LCD) works. This dynamic film, however, has the added advantage in that it may be bent/flexed around any curved surface, unlike most rigid LCDs. Other applications would include dynamically changing signs/billboards, active packaging/labeling, electrically switchable polarizing films for use in, as an example, car tinting films, greenhouses, optical modulating films for switches and waveguides, and so on. Such dynamic light control films would have tremendous opportunity for a wide range of applications.

Another film technology that is related to the present invention is that of piezoelectric films. Piezoelectricity refers to materials that generate a voltage when stress is applied, or alternatively, deform when a voltage is applied. Piezoelectric materials/films are used in a wide range of applications including electrical crystals, transducers, touchpads and screens, loudspeakers, ultrasonics, sensors, etc. There are a vast number of piezoelectric materials with the most common being quartz, various ceramics like zirconium titanate and barium titanate, and polymeric films based on poly(vinylidene fluoride) (PVDF). PVDF is commonly sold under the tradename of Kynar™ from Total Atofina and is more flexible and resilient than the brittle ceramics.

PVDF achieves its piezoelectricity only after it has been properly oriented and electrically poled to properly align the dipoles. Unoriented PVDF is in a non-polar "alpha" phase where the hydrogen and fluorine atoms are randomly arranged. In contrast, orientation causes a second randomly oriented crystal form referred to as the "beta" phase where the hydrogen and fluorine atoms are arranged on opposite sides of the chain, thus forming an electric dipole. For piezoelectric activity to occur, all of these dipoles need to be aligned in the same general direction. This is done by electrically "poling" the film at high temperature and under high electric field, to induce all of the dipoles to orient in the same direction. The sample is then quenched to lock-in this alignment. Under the application of a subsequent voltage or electric field, these aligned dipoles will try to realign relevent to the field direction, thus causing the deformation known as the piezoelectric effect. Similarly, if the film is stressed or deformed such that the dipoles are mechanically realigned, a voltage will be created across the film, which can be measured, as is the case with many piezoelectric sensors.

While there are many applications around PVDF films, most are non-piezoelectric in nature as the film is never oriented and electrically poled. Similarly, the use of such films in microcoextruded structures in a piezoelectric form (i.e., oriented and poled) is also not known. Thus, it would be desirable to incorporate piezoelectrically active films as part of a light controlling multilayer "iridescent" structure. Such a structure would be able to change its reflectivity and light controlling properties by applying an electrical voltage. The resulting dynamic film would be able to provide optical modulation in a more flexible, versatile form than, for example, traditional rigid LCDs. As stated previously, such a light controlling film would have applications in optical devices such as, for example, polarizers, optical compensators, brightness enhancing and reflective films, aesthetic films such as decorative packaging films, and "hot" and "cold" mirrors that selectively reflect only certain wavelengths, and liquid crystal displays.

SUMMARY OF THE INVENTION

Briefly, the present invention provides a multilayer film comprising 5 or more layers, at least 3 of which are piezoelectrically active, in which the reflectivity and other optical properties of the film can be dynamically changed via application of an electric field. The piezoelectric layers are preferably polymeric in nature and separated by intervening non-piezoelectric layers.

DETAILED DESCRIPTION OF THE INVENTION

Figure 1:
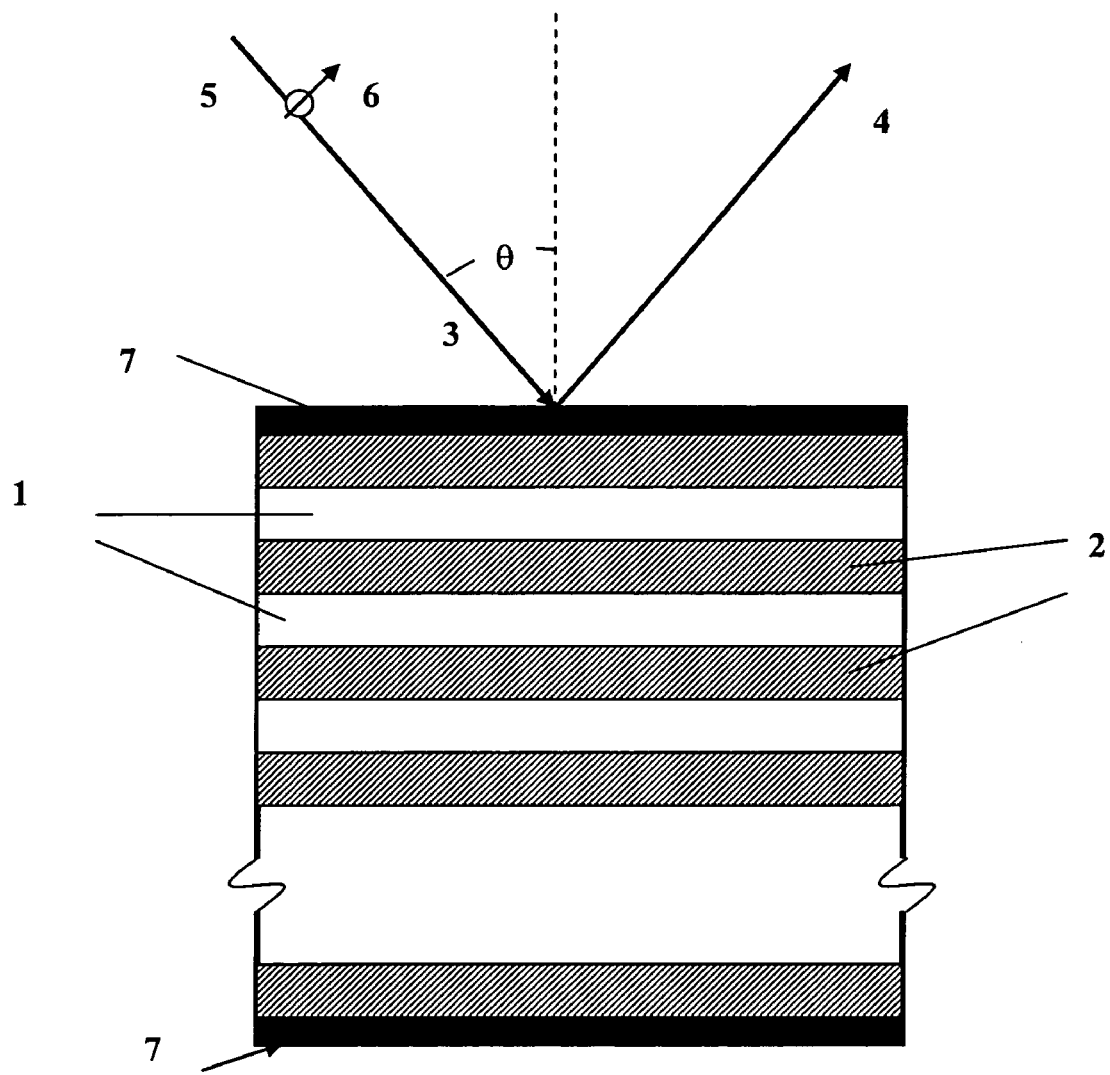
FIG. 1 is a schematic of a multilayered film incorporating piezoelectric layers.

The present invention provides a multilayered light control film, having 5 or more total layers, at least 3 of which are piezoelectrically active, wherein the reflectivity and other optical properties can by dynamically changed or modulated via application of an electrical field. The piezoelectric layers are preferably polymeric in nature and made from poly(vinylidene fluoride) or copolymers of vinylidene fluoride. Furthermore these piezoelectric layers are preferably separated by intervening non-piezoelectric layers. Such optical films include, but are not limited to, interference polarizers, mirrors, colored films, displays and combinations thereof wherein the optical properties can be rapidly and easily changed by an applied voltage. The films are optically active over a broad range of the ultraviolet, visible, and infrared spectra depending on the design. Of particular interest are coextruded polymeric multilayer optical films having one or more layers that are birefringent in nature wherein at least 3 layers are piezoelectrically active.

Unless otherwise indicated, all numbers expressing quantities of ingredients, properties such as molecular weight, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, each numerical parameter should at least be construed in light of the number of reported significant digits and by applying ordinary rounding techniques. Further, the ranges stated in this disclosure and the claims are intended to include the entire range specifically and not just the endpoint(s). For example, a range stated to be 0 to 10 is intended to disclose all whole numbers between 0 and 10 such as, for example 1, 2, 3, 4, etc., all fractional numbers between 0 and 10, for example 1.5, 2.3, 4.57, 6.1113, etc., and the endpoints 0 and 10. Also, a range associated with chemical substituent groups such as, for example, "$C_1$ to $C_5$ hydrocarbons", is intended to specifically include and disclose $C_1$ and $C_5$ hydrocarbons as well as $C_2$, $C_3$, and $C_4$ hydrocarbons.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements.

As used herein, the articles "a," "an" and "the" include their plural referents unless the context clearly dictates otherwise. For example, reference to a "polymer," or a "shaped article," is intended to include the processing or making of a plurality of polymers, or articles. References to a composition containing or including "an" ingredient or "a" polymer is intended to include other ingredients or other polymers, respectively, in addition to the one named.

By "comprising" or "containing" or "including," it is meant that at least the named compound, element, particle, or method step, etc., is present in the composition or article or method, but does not exclude the presence of other compounds, catalysts, materials, particles, method steps, etc., even if the other such compounds, material, particles, method steps, etc., have the same function as what is named, unless expressly excluded.

It is also to be understood that the mention of one or more method steps does not preclude the presence of additional method steps before or after the combined recited steps or intervening method steps between those steps expressly identified. Moreover, the lettering of process steps or ingredients is a convenient means for identifying discrete activities or ingredients and the recited lettering can be arranged in any sequence, unless otherwise indicated.

There are many methods for making the multilayer structures of the present invention. The present invention is not limited by the various approaches. The various approaches and multilayer micro-coextrusion devices are described, for example, in U.S. Pat. Nos. 3,557,265; 3,759,647; 3,773,882; and 3,884,606, the contents of which are herein incorporated by reference.

Typically, two or more different resins are each extruded and brought together into a special micro-coextrusion feedblock. The feedblock differs from conventional feedblocks (e.g., those used to make standard 2 to 10 layer commodity films) in that the layers are repeatedly folded and stacked or otherwise combined together, thereby creating a very large number of alternating layers. Typically, at least 10 layers are needed, although 20 to 1000 layers or more are preferred for better reflectivity. The actual method for forming these alternating layers is not a limiting factor. Although coextrusion is preferred, lamination or hand lay-up can also be used, albeit with less consistent final properties.

If two different polymers are used (denoted as polymer A and polymer B), then they might, for example, be folded and recombined into an alternating A/B structure containing as much as 100 or more total layers. The repeat unit of this structure is the A/B film which is repeated 50 times for a 100-layer (total) film. This structure is denoted in shorthand notation as $(A/B)^{50}$. If such a structure is further modified by adding a protective film of polymer C on the front surface, and a layer of polymer D on the back surface, then the shorthand notation is C(A/B)$^{50}$D. As another example, an alternating structure containing polymers A, B, and C, repeated 25 times (for a total of 75 layers) would be denoted as (A/B/C)$^{25}$. Another possible structure would be (A/B/C/B)$^{25}$ wherein the B layer might represent an adhesive or "tie" layer to help bond the functional layers A and C together. Regardless, the structure of the present invention should have 5 or more total layers with at least 3 piezoelectric layers with each of these piezoelectric layer separated by one or more non-piezoelectric intervening layers. The intervening layer(s) may be one or more non-piezoelectrically active layers or tie layers or both. These intervening layers are preferably polymeric in nature, but could also include inorganic materials such as sputter coated glass, indium-tin oxide (ITO), etc. as long as these individual layers are substantially transparent within the wavelengths of interest. The term "substantially transparent" means that the layers permit passage of sufficient amounts of the desired wavelengths to produce the desired optical effects.

An example of an A/B structure of the present invention is shown in FIG. 1. Layers A and B are denoted by 1 and 2 where 1 is a piezoelectric material and 2 is a non-piezoelectric, "second" polymer such as PET or PEN. Attached on the top and bottom surfaces of the overall structure is a conductive layer 7 (preferably clear) through which the electric voltage will be applied. Incident light 3 hits the surface at an incidence angle θ relative to normal to the surface of the conductive layer and reflected as light ray 4. Note that the incident light 3 is composed of wavelengths polarized "out of the page" 5 denoted as $E_s$ (represented by the circle on incident light 3 which represents an arrow pointed "out of the page") and wavelengths "in the plane of the paper" 6 denoted as $E_p$ (represented by the arrow perpendicular to the direction of incident light 3).

The piezoelectrically active material 1 is preferably poly (vinylidene fluoride) as it is the most commonly available and effective piezoelectric polymer film. PVDF is sold by Dyneon, and by Total Atofina under the tradename Kynar™. Nevertheless, other piezoelectrically active polymers including, but not limited to poly(vinyl fluoride) (PVF), aromatic polyamides, polysulfone, cyanoethyl cellulose, polyvinylidene chloride, polyparaxylene, and copolymers of poly (vinylidene fluoride) and trifluoroethylene can also be used. PVDF has good light transmittance, and can be processed at temperatures typical of the other materials commonly used in standard micro-coextruded films. To be piezoelectrically active, however, a PVDF film must be stretched below 130° C. to several times, typically 2 to 6 times, its original length in order to create the beta crystal form. Fortunately for the present invention, this stretching condition is very compatible with the stretching of most typical polymers that might be used as the non-piezoelectric intervening layer (e.g., polyesters, styrenics, acrylics, nylons, etc.). This beta form of PVDF has the hydrogen and fluorine groups arranged on opposite sides of the chain, thereby forming a dipole. To achieve useful piezoelectric properties, however, the film must also be electrically poled to align the dipoles. There are a number of ways of achieving this. More commonly, poling typically involves holding the film at a temperature of 80 to 120° C. while exposing it to an electric field of 50 to 150 MV/m (50 to 150 V/micron). Poling times are on the order of 30 minutes to 2 hours after which the film is cooled to room temperature while still under the electric field. Note that these conditions are for PVDF and will need to be varied accordingly if a different piezoelectric material is used. Other methods for poling also exist. For example, it is possible to pole PVDF by way of corona treatment. Alternatively, the film can be poled simultaneously as it is being stretched. It is also possible to pole PVDF at room temperature but this requires much higher electric fields (100 to 800 MV/m). Regardless of the method, the film should be kept below about 110° C. after polarizing to prevent spontaneously depolarization and loss of piezoelectric properties.

Processing temperatures will depend on the polymers used. PVDF has a melting temperature of about 170° C. with typical extrusion temperatures being 200° C. or higher. In the feedblock, it is desirable, but not critical, that the melt extrusion temperature of the A and B layers be as close as possible so as to minimize thermal gradients during equilibration, which can distort the flow. Thus, it might be desirable to extrude the PVDF at, for example, 240° C. to 250° C. if it were to be matched with PET (melting temperature of 240° C.) for uniform coextrusion so as to minimize layer distortion. This might be done, for example, by choosing a different melt index PVDF, or in the case of a polyester, a different intrinsic viscosity (IV). Balancing of viscosities to ensure proper coextrusion is well known in the art.

After being folded and stacked into the multiple layers, the coextruded layers are typically cast onto a chill-roll, and then typically stretched either uniaxially or biaxially depending on what optical properties are desired. Stretching helps to reduce the thickness of each layer into the appropriate range needed for optical interference. This thickness is nominally in the range of a few microns or less for visible light. Stretching can be performed by methods well known in the art including drafting, tentering, blown film extrusion (double-bubble), etc. In the case of blown film, no intermediate casting step is needed as the film is quenched in bubble form. After orientation, heatsetting of the film can optionally be applied by constraining the film while exposing it to high temperatures. Actual heatsetting temperatures depend on the polymer used, but are nominally 150 to 250° C. for polyesters. Because of PVDF's low melting temperature, however, the heatsetting temperature ideally should not exceed 180° C. Heatsetting is well known to those skilled in the film making art. If the film is not heatset, it might be useful in applications where heat-induced shrinkage is desirable such as in shrink labels, although the thickness of the layers, and hence the light modulating properties of the film, will vary significantly with shrinkage.

Stretching temperatures will also depend on the polymers used. In the case of a glassy resin like PET or PEN, the stretch temperature is typically between the glass transition temperature (Tg) and about Tg+50° C. Tg's for PET and PEN are 77 and 120° C., respectively. Nevertheless, stretching temperature should ideally be kept below 130° C. in order to induce the beta phase in PVDF. This is outside the stretch window for higher Tg polymers like polycarbonate (Tg=150° C.) so stretching cannot be performed in situ on the pre-formed multilayer film. Instead, these films would have to be individually stretched and laminated with oriented PVDF. Optimal stretch temperature will depend on rate of stretching, other resins present, and the desired final orientation. Colder stretch temperatures impart greater orientation, and hence greater birefringence, however, some of the other polymers may not be stretchable so a compromise may have to be reached. Furthermore, some applications may not require much birefringence so higher temperatures may be acceptable.

Stretch ratios will also depend on the polymers in use. Many polymers like crystalline PET, have a natural draw ratio where film processing is optimal. This range is typically from about 3× to about 5×. For olefins, styrenics, etc., the optimal draw ratio may be as high as 10×. As with temperature, a compromise may have to be made to balance the different resins. Stretching can be either uniaxial or biaxial in nature. Alternatively, if the desired thinness of the layers can be achieved via melt casting or lamination and a birefringent film is not needed, then the stretching process can optionally be left out if, for example, the piezoelectric material being used does not require stretching to activate, or the layers are being laminated together.

The "second" or "B" polymer in this example is the non-piezoelectric polymer used in conjunction with the piezoelectric layers. There can be more than one "second" polymer (which may be referred to as the "third", "fourth" and so on). A variety of polymer materials suitable for use have been described, for example, in U.S. Pat. No. 6,827,886, which is incorporated herein by reference. Regarding the preferred materials from which the films are to be made, there are several conditions which should be met to make certain multilayer optical films of this invention. First, these films should contain at least two distinguishable polymers, one of which is piezoelectrically active. The number of polymers is not limited, and three or more polymers may be advantageously used in particular films. Second, for some applications (but not all), at least one of the polymers preferably develops a large birefringence when stretched. Depending on the application of the multilayer film, the birefringence may be developed between two orthogonal directions in the plane of the film, between one or more in-plane directions and the direction perpendicular to the film plane, or a combination of these. Because polymeric materials are typically dispersive, that is, the refractive indices vary with wavelength, these conditions should be considered in terms of a particular spectral bandwidth of interest.

Other aspects of polymer selection depend on specific applications and are well known in the art. For polarizing films, it is advantageous for the difference in the index of refraction of the piezoelectric and second polymers in one film-plane direction to differ significantly, greater than about 0.05, preferable greater than about 0.1, in the finished film, while the difference in the orthogonal film-plane index is minimized, i.e., typically less than about 0.05. In the present invention, the use of the piezoelectrically active layers allows the polarization to selectively be turned "on" or "off" by application of an electric field. If the polarizer is active in its quiescent state, then application of the electric field will cause the piezoelectric layers to change thickness, thereby changing their reflectivity. With proper design, the reflectivity for a given polarization can be modified significantly so as to switch the polarization on or off.

Different considerations apply to a reflective, or mirror, film. Provided that the film is not meant to have some polarizing properties as well, refractive index criteria apply equally to any direction in the film plane. Thus, it is typical for the indices of any given layer in orthogonal in-plane directions to be nearly equal, i.e., typically less than about 0.05. It is advantageous, however, for the film-plane indices of the piezoelectric polymer to differ as greatly as possible, typically greater than about 0.05, preferably greater than about 0.1, from the film-plane indices of the second polymer. For this reason, if the piezoelectric polymer has a high index of refraction when isotropic, it is advantageous that it also be positively birefringent. Likewise, if the piezoelectric polymer has a low index of refraction when isotropic, it is advantageous that it also be negatively birefringent. The second polymer advantageously develops little or no birefringence when stretched, or develops birefringence of the opposite sense (positive-negative or negative-positive), such that its film-plane refractive indices differ as much as possible from those of the first polymer in the finished film. With the final film, application of an electric field or voltage will cause the piezoelectric layers to expand or contract (depending on the polarity of the voltage), which will cause the reflectivity to shift. It is possible to almost completely turn the reflectivity on or off (depending on previous state), simply by varying the voltage. This could have application for light controlled window glazing as a replacement for shutters/curtains.

Color enhancing iridescent films can be regarded as special cases of mirror and polarizing films. Thus, the same criteria outlined above apply. The perceived color is a result of reflection or polarization over one or more specific bandwidths of the spectrum. The bandwidths over which a multilayer film of the current invention is effective will be determined primarily by the distribution of layer thicknesses used in the optical stack(s), but consideration must also be given to the wavelength dependence, or dispersion, of the refractive indices of the first and second polymers. It will be understood that the same rules apply to the infrared and ultraviolet wavelengths as to the visible colors. As with the above films, the application of an electric field will cause a change in piezoelectric layer thickness, and hence reflectivity, so the color of the film will change as well. This could find use in aesthetic displays that, for example, change color with music, sound intensity or other signal input.

Although many polymers may be chosen as the second polymer, certain of the polyesters have the capability for particularly large refractive index (or birefringence). Among these, polyethylene 2,6-naphthalate (PEN) has a very large positive stress optical coefficient, retains birefringence effectively after stretching, and has little or no absorbance within the visible range. It also has a large index of refraction in the isotropic state. Its refractive index for polarized incident light of 550 nm wavelength increases when the plane of polarization is parallel to the stretch direction from about 1.64 to as high as about 1.9. Its birefringence can be increased by increasing its molecular orientation which, in turn, may be increased by stretching to greater stretch ratios with other stretching conditions held fixed. As described earlier, however, its high Tg and stretching temperature present a very narrow window with PVDF, although it can still be used. In many cases, PEN copolymers are preferred so as to broaden the stretching window.

Other semicrystalline naphthalene dicarboxylic polyesters are also suitable. These polymers may be homopolymers or copolymers, provided that the use of comonomers does not substantially impair the stress optical coefficient or retention of birefringence after stretching. The term "PEN" as used herein will be understood to include copolymers of PEN meeting these restrictions. Likewise, the term "PET" and "polyester" will be understood to encompass all terephthalic acid based polyesters and their copolymers. In practice, these restrictions impose an upper limit on the comonomer content, the exact value of which will vary with the choice of comonomer(s) employed. Some compromise in these properties may be accepted, however, if comonomer incorporation results in improvement of other properties. Such properties include but are not limited to improved interlayer adhesion, lower melting point (resulting in lower extrusion temperature), better Theological matching to other polymers in the film, and advantageous shifts in the process window for stretching due to change in the glass transition temperature.

Polyethylene terephthalate (PET), poly(cyclohexylene dimethylene terephthalate) (PCT) and the intermediate copolymers like PETG, are other materials that exhibit a significant positive stress optical coefficient, retain birefringence effectively after stretching, and have little or no absorbance within the visible range. Thus, they may be used as second polymers in some applications of the current invention. These have a stretching window that is much more condudve to usage with PVDF than PEN.

Suitable comonomers for use in PEN, PET, PCT or the like may be of the diol or dicarboxylic acid or ester type. Dicarboxylic acid comonomers include but are not limited to terephthalic acid, isophthalic acid, phthalic acid, all isomeric naphthalenedicarboxylic acids (2,6-, 1,2-, 1,3-, 1,4-, 1,5-, 1,6-, 1,7-, 1,8-, 2,3-, 2,4-, 2,5-, 2,7-, and 2,8-), bi-benzoic acids such as 4,4'-biphenyl dicarboxylic acid and its isomers, trans-4,4'-stilbene dicarboxylic acid and its isomers, 4,4'-diphenyl ether dicarboxylic acid and its isomers, 4,4'-diphenylsulfone dicarboxylic acid and its isomers, 4,4'-benzophenone dicarboxylic acid and its isomers, halogenated aromatic dicarboxylic acids such as 2-chloroterephthalic acid and 2,5-dichloroterephthalic acid, other substituted aromatic dicarboxylic acids such as tertiary butyl isophthalic acid and sodium sulfonated isophthalic acid, cycloalkane dicarboxylic acids such as 1,4-cyclohexanedicarboxylic acid and its isomers and 2,6-decahydronaphthalene dicarboxylic acid and its isomers, bi- or multi-cyclic dicarboxylic acids (such as the various isomeric norbornane and norbornene dicarboxylic acids, adamantane dicarboxylic acids, and bicyclo-octane dicarboxylic acids), alkane dicarboxylic acids (such as sebacic acid, adipic acid, oxalic acid, malonic acid, succinic acid, glutaric acid, azelaic acid, and dodecane dicarboxylic acid), and any of the isomeric dicarboxylic acids of the fused-ring aromatic hydrocarbons (such as indene, anthracene, pheneanthrene, benzonaphthene, fluorene and the like). Alternatively, alkyl esters of these monomers, such as dimethyl terephthalate, may be used.

Suitable diol comonomers include but are not limited to linear or branched alkane diols or glycols (such as ethylene glycol, propanediols such as trimethylene glycol, butanediols such as tetramethylene glycol, pentanediols such as neopentyl glycol, hexanediols, 2,2,4-trimethyl-1,3-pentanediol and higher diols), ether glycols (such as diethylene glycol, triethylene glycol, and polyethylene glycol), ester diols such as 3-hydroxy-2,2-dimethylpropyl-3-hydroxy-2,2-dimethyl propanoate, cycloalkane glycols such as 1,4-cyclohexanedimethanol and its isomers and 1,4-cyclohexanediol and its isomers, bi- or multicyclic diols (such as the various isomeric tricyclodecane dimethanols, norbornane dimethanols, norbornene dimethanols, and bicyclo-octane dimethanols), aromatic glycols (such as 1,4-benzenedimethanol and its isomers, 1,4-benzenediol and its isomers, bisphenols such as bisphenol A, 2,2'-dihydroxy biphenyl and its isomers, 4,4'-dihydroxymethyl biphenyl and its isomers, and 1,3-bis(2-hydroxyethoxy)benzene and its isomers), and lower alkyl ethers or diethers of these diols, such as dimethyl or diethyl diols, where the lower alkyl group contains 1 to 20 carbon atom, preferably 1 to 15 carbon atoms, more preferably 1 to 10 carbon atoms.

Other additives such as branching agents including, but are not limited to, multifunctional acids or multifunctional alcohols such as trimellitic acid, trimellitic anhydride, pyromellitic dianhydride, trimethylolpropane, glycerol, pentaerythritol, citric acid, tartaric acid, 3-hydroxyglutaric acid and the like, chain extenders including, but are not limited to, multifunctional (including, but not limited to, bifunctional) isocyanates, multifunctional epoxides, including for example, epoxylated novolacs, and phenoxy resins, and ionomeric groups (e.g., sulfopolymers like sodiosulfoisophthalic acid) can be added to one or more of the polymers to improve processing or other properties.

It is not required that the second polymer be a polyester. Vinyl polymers and copolymers made from monomers such as vinyl naphthalenes, styrenes, ethylene, maleic anhydride, acrylates, acetates, and methacrylates may be employed. Condensation polymers other than polyesters and polycarbonates may also be used. Examples include: polysulfones, polyamides, polyurethanes, polyamic acids, and polyimides. Naphthalene groups and halogens such as chlorine, bromine, and iodine are useful for increasing the refractive index of the second polymer to a desired level. Acrylate groups and fluorine are particularly useful in decreasing refractive index when this is desired. Since PVDF has a relatively low isotropic refractive index (n=1.42), candidates for the second polymer will typically be those with higher refractive indices.

It should be understood from the foregoing discussion that the choice of a second polymer is dependent not only on the intended application of the multilayer optical film in question, but also on the choice made for the piezoelectric polymer, and the processing conditions employed in stretching. Suitable second polymer materials include but are not limited to polyalkylene naphthalates (such as polyethylene naphthalate (PEN) and isomers thereof (such as 2,6-, 1,4-, 1,5-, 2,7-, and 2,3-PEN)), polyalkylene terephthalates (such as polyethylene terephthalate, polybutylene terephthalate, and poly-1,4-cyclohexylene dimethylene terephthalate), polycarbonates, polyarylates, polyamides (such as nylon 6, nylon 11, nylon 12, nylon 4/6, nylon 6/6, nylon 6/9, nylon 6/10, nylon 6/12, and nylon 6/T), polyimides (including thermoplastic polyimides and polyacrylic imides), polyamide-imides, polyetheramides, polyether-imides, polyaryl ethers (such as polyphenylene ether and the ring-substituted polyphenylene oxides), polyarylether ketones such as polyetheretherketone ("PEEK"), aliphatic polyketones (such as copolymers and terpolymers of ethylene and/or propylene with carbon dioxide), polyphenylene sulfide, polysulfones (including polyethersulfones and polyaryl sulfones), atactic polystyrene, syndiotactic polystyrene ("sPS") and its derivatives (such as syndiotactic poly-alpha-methyl styrene and syndiotactic polydichlorostyrene), blends of any of these polystyrenes (with each other or with other polymers, such as polyphenylene oxides), copolymers of any of these polystyrenes (such as styrene-butadiene copolymers, styrene-acrylonitrile copolymers, and acrylonitrile-butadiene-styrene terpolymers), polyacrylates (such as polymethyl acrylate, polyethyl acrylate, and polybutyl acrylate), polymethacrylates (such as polymethyl methacrylate, polyethyl methacrylate, polypropyl methacrylate, and polyisobutyl methacrylate), cellulose derivatives (such as ethyl cellulose, cellulose acetate, cellulose propionate, cellulose acetate butyrate, and cellulose nitrate), polyalkylene polymers (such as polyethylene, polypropylene, polybutylene, polyisobutylene, and poly(4-methyl)pentene), ionomeric resins, elastomers (such as polybutadiene, polyisoprene, and neoprene), silicone resins, epoxy resins, and polyurethanes.

A deliberate mismatching (or matching) of the normal-to-plane refractive index may also be desirable depending on the desired effect. For example, normal-to-plane matching of the refractive indices for the A and B layers (and others if present) can be useful for improving a film's reflectivity as a function of incident angle, thus providing better film performance.

Control of layer thickness is especially useful in producing films having specific layer thicknesses or thickness gradient profiles that are modified in a prescribed way throughout the thickness of the multilayer film. For example, several layer thickness designs have been described for infrared films, which minimize higher order harmonics. Such harmonics can cause color in the visible region of the spectrum. Examples of such film include those described in U.S. Pat. No. RE 34,605, which is incorporated herein by reference, which describes a multilayer optical interference film comprising three diverse substantially transparent polymeric materials, A, B, and C and having a repeating unit of ABCB.

Each original portion of the multilayer stack that exits the feedblock manifold is known as a packet. In a film for optical applications, each packet is designed to reflect, transmit, or polarize over a given band of wavelengths. More than one packet may be present as the multilayer stack leaves the feedblock, but the piezoelectric polymer layers should be present in at least one of the packets.

Skin layers are frequently added to the multilayer stack to protect the thinner optical layers from the effects of wall stress and possible resulting flow instabilities. Other reasons for adding a thick layer at the surface(s) of the film include, e.g., surface properties such as adhesion, coatability, release, coefficient of friction, and barrier properties, weatherability, scratch and abrasion resistance, and others. Skin layers are known to those skilled in the art.

The films made in accordance with the invention may also be provided with one or more adhesives to laminate the optical films of the present invention to another film, surface, or substrate. Such adhesives include both optically clear and diffuse adhesives, as well as pressure sensitive and non-pressure sensitive adhesives. The optical films and devices of the present invention may further be laminated to rigid or semi-rigid substrates, such as, for example, glass, metal, acrylic, polyester, and other polymer backings to provide structural rigidity, weatherability, or easier handling. For example, the optical films of the present invention may be laminated to a thin acrylic or metal backing so that it can be stamped or otherwise formed and maintained in a desired shape. For some applications, such as when the optical film is applied to other breakable backings, an additional layer comprising PET film or puncture-tear resistant film may be used.

Because of the piezoelectric effect and the need for electrical contact on the surfaces, the films will typically have electrodes placed on the surface. These may provide solid coverage, or may be in a pattern, and can be produced by metallization, photoresist, indium tin oxide (ITO) coating, conductive pens, and so forth. Ideally, they should be substantially clear on the side(s) in which optical viewing will be performed.

The films and coatings of the present invention may also comprise other materials or additives as are known to the art. Such materials include binders, coatings, flame retardants, conductive layers/additives, antistats, barrier additives/layers, UV absorbers, pinning agents, UV stabilizers, voiding agents, dyes (visible, UV, and IR), dichroic dyes, photochromic dyes, pigments, fillers, compatibilizers, antiblocks, slips, lubricants, surfactants, antimicrobial agents, foaming agents, reinforcers, heat stabilizers, impact modifiers, plasticizers, viscosity modifiers, aesthetic agents (e.g., glitter) and other such materials. The films may also be coated or primed to improve properties. This includes hardcoats to improve scuff resistance, antifogs, antireflective coatings, surfactants and plasma, flame, corona or e-beam treatment can be used to improve surface adhesion or printability. Inorganic type piezoelectric materials and ceramics may also be included as layers or as a blend component in one or more of the layers (e.g. ground up and blended into PVDF to enhance its piezoelectric properties) although their use is typically limited since they tend to be opaque.

Layer thickness is an aspect of this invention and is a factor in making iridescent films work properly. It is the variation of the thickness of the piezoelectric layer via applied voltage that allows the invention to easily alter the iridescent properties. Layer thicknesses are typically of the order of the wavelength of light (0.3 to 0.7 microns) in order to maximize optical interference, but a wide range of thicknesses can be used depending on the desired optical effects. For example, the thickness of each layer can range from 0.05 to 5 microns. More typically, the thickness range for each layer will be between about 0.075 micron and about 3 microns, although other ranges may still be useful. This interference is responsible for the various polarization, color, and reflective effects observed. For example, as in FIG. 1, a multilayered film with light hitting it at a normal incidence angle ($\theta=0$), with a wavelength of $\lambda$, will be almost totally reflective if each layer has a thickness that is equal to one-quarter the wavelength of the incident light (e.g., $\lambda/4$) or some odd numbered multiple of $\lambda/4$ (e.g., $3\lambda/4$, $5\lambda/4$, $7\lambda/4$, etc.). This is because the light that reflects at each layer interface will constructively interfere with the reflected light from the other interfaces resulting in a near perfect reflection. As the layer thicknesses deviate from $\lambda/4$, then the constructive interference is diminished until such point that the film becomes a poor reflector (most of the light is transmitted through the film instead). At layer thicknesses of $\lambda/8$ and $\lambda/2$ (and even numbered multiples of $\lambda/4$), the reflectivity will be almost completely zero, resulting in full transmission.

Note that in the above example, the wavelength $\lambda$ is dependent on the refractive index of the layer. The relationship is $\lambda=\lambda_o/n$ where n is the refractive index of the medium, and $\lambda_o$ is the wavelength in a vacuum (or air). Thus, a wavelength of 0.5 microns in air (refractive index=1) will have a wavelength of 0.25 micron in a medium having a refractive index of 2. So for an alternating two-layer structure where the layers have refractive index of 1 and 2, the film thicknesses for $\lambda/4$ layers are 0.125 microns and 0.0625 microns, respectively.

It should also be noted that the thickness for a $\lambda/4$ layer (or odd number multiple) is only valid at one wavelength. For visible light (or other wavelengths like IR or UV), there is a spread in wavelengths. Only the wavelength that meets the $\lambda/4$ criterion (or related multiple) will be fully reflected, with the others being partially reflected or transmitted depending on their relative wavelength. It is this dispersion in reflection that causes the color in the film as only some get transmitted (or reflected) for a given film.

As described earlier, the polarization of the incident wave is also a factor. Waves that are polarized parallel to the film surface are herein denoted as $E_s$ waves. Those polarized perpendicular to this are $E_p$ waves. The behavior of each varies considerably as the angle of incidence $\theta$ varies from 0 (normal incidence) to 90 degrees (grazing incidence). Furthermore, if the film is birefringent, having differing refractive indices in each direction, then the relative reflection of each wave polarization has to be treated separately.

Incidence angle is a factor because it affects the apparent thickness of the film. As the grazing angle increases, the effective thickness becomes equal to the original thickness divided by the cosine of the incidence angle. As a result, a structure that meets the $\lambda/4$ criterion for reflectivity at one angle of incidence, will not meet it at another. This leads to angular dependence of the various optical properties of the film. Because of this, and other factors like wavelength dependence on reflectivity, the film design process is used to determine an optical structure that meets all of the fitness for use criteria of a given application.

Although the primary mechanism by which this multilayer film of the invention modulates/reflects light waves is by changes in interference through changes in layer thickness, it should also be understood that for birefringent layers, the changes in thickness will also cause changes in optical retardation (where retardation equals the birefringence times the thickness). This retardation can be both the in-plane value commonly denoted as "Re" which is equal to the in-plane birefringence times the thickness, or "Rth" which is defined as L[(nx+ny)/2−nz] where nx and ny are the in-plane refractive indices, nz is the thickness refractive index, and L is the thickness. Control of Re and Rth is desirable, for example, in providing wide viewing angles for LCD type displays. Similarly, Re and Rth can be varied for the present invention via a change in voltage. Note that controlling retardation usually implies the presence of one or more polarizing layers as part of the structure. If white light is passed through a retarding film that is placed between crossed-polarizers, the resulting transmitted light will vary in color from black to white, including various colors in the rainbow, based on the actual amount of retardation present (e.g., retardation equal to muliples of the average wavelength of incident light will produce no transmitted light or "black"). Thus, varying the retardation via changes in voltage of the micro-coextruded film could be used to also change color, in addition to the interference/reflection mechanism discussed previously.

As discussed earlier, there are many different piezoelectric materials, although the discussion here is focused around PVDF because it is the most common, most flexible, and easiest to process. PVDF achieves its piezoelectric activity by orientation and then electric poling. The poling direction defines how the in-use voltage should be applied. If the voltage polarity and piezoelectric polarity are the same, then the film will tend to contract when the voltage is applied. If reversed, the film will expand. Either approach can be used depending on which film deformation is best for a given application. Note, however, that piezoelectric films do not react well to static voltages as the dipoles rapidly decay with time. Thus, it is preferred that the applied voltage be applied dynamically, as, for example, in a square wave. The frequency of the voltage should be greater than about 1 Hertz, since the dipole relaxation time is typically of the order of 1 second.

The electrical poling of the piezoelectric film can be applied in situ as part of the entire microcoextruded structure. Since the film will be stretched anyway, the only thing remaining is the poling. It is desirable, however, that the second polymer be properly stable at the poling temperature, and not undergo any type of dielectric breakdown.

The inter-relation between voltage and dimensional change of the film can be calculated from $$\in_3 = d_{33}E_3 = d_{33}V/L$$

where $\in_3$ is the strain in the thickness or "3" direction of the piezoelectric layer, $E_3$ is the electric field in the thickness direction (=V/L), L is the total film thickness, V is the applied voltage, and $d_{33}$ is the piezoelectric coefficient (equal to about $30\times10^{-12}$ m/V for PVDF). The subscript "33" refers to the stress and voltage being perpendicular to the film (i.e., in the thickness direction). The strain $\in_3$ is equal to $\Delta L/L_i$ where $\Delta L$ is the change in thickness of the piezoelectric layer which has an initial layer thickness $L_i$. Simplifying, $$\Delta L = d_{33}VL_i/L$$

Thus, from the above equation, one can calculate the change in thickness for a given applied voltage, or alternatively, the change in voltage for an applied deformation. In the above equation, $\Delta L$ is in meters. In an ideal sense, the piezoelectric film is free to expand and contract so that all of the strain is related to the applied voltage. This is the case when the entire surface area of the film is supplied with the applied voltage. For localized voltages, as might be experienced in a multipixel display, some of the strain will be the result of constraints place on the structure by the surrounding polymer. In other words, only part of the piezoelectric film will be under the influence of the voltage, with the surrounding materials acting to resist deformation. In this case, the applied voltage will need to be higher to achieve a given level of film expansion (or contraction) as the resulting stresses have to push against the surrounding material.

PVDF has a very low refractive index (isotropic n=1.42) compared to most other polymers (especially polyesters) making it an ideal component. If it is to be included in a λ/4 structure for a nominal wavelength in air of 0.5 microns, this would correspond to a layer thickness of 0.178 microns. As voltage is applied and the thickness deviates from this, the reflectivity of the film will drop correspondingly.

For many applications, it is preferred that the deformation be such that the film changes from fully reflective to fully transmissive, or vice versa. This implies, for example, that the piezoelectric layers change from λ/4 (or an odd multiple of λ/4) to λ/8 (or an even multiple of λ/4), or some similar combination. In the case of λ/4 to λ/8, this requires a strain of 0.5 (or 50%) which is higher than can be achieved with reasonable voltage levels (such high voltages would lead to dielectric breakdown or depoling of the piezoelectric). Thus, for most applications, the strain levels should ideally be designed to be less than about 20%, more preferably less than about 10%, and most preferably less than about 2%, in order to keep voltage levels reasonable. This can be more easily accomplished by starting with piezoelectric film thicknesses that are higher order multiples of λ/4, such as, for example a thickness equal to 7λ/4 instead of λ/4. The strain required to change from 7λ/4 (reflective) to 6λ/4 (transmittive) is only 3%, as opposed to the 50% required for the first order film. Of course, even higher order thicknesses will require even less strain, and thus less voltage to switch from reflective to transmissive. The trade-off is that thicker films will have a narrow viewing angle range over which reflection change is significant.

As an example calculation, if one assumes an initial thickness of 0.086 microns (λ/4), then for a 1% strain, the value of ΔL is 0.00086 microns, and the required applied electric field is 330 V/micron. For a 50% strain, the electric field required becomes 16.7 kV/micron. The final required voltage will depend on the total thickness of the microcoextruded film. So for a film that is 10 microns in total thickness, the applied voltage would be 3300 V to achieve the 1% strain and 166 kV for the 50% strain. The latter voltage is too high to be safe and is thus not practical, but the former voltage can easily be achieved using a battery source and a simple inverter circuit.

This invention can be further illustrated by the following examples of preferred and comparative embodiments, although it will be understood that these examples are included merely for purposes of illustration and are not intended to limit the scope of the invention.

EXAMPLES

Most of the examples are based on matrix theory calculations for iridescent optics, as outlined in Chapter 42 of *Handbook of Optics, Vol. I*, Michael Bass, Ed., McGraw-Hill, New York, pp 42.10 to 42.14, which is incorporated herein by reference in its entirety. These matrix calculations predict the total reflectance and transmission as a function of layer geometry, polarization, and incidence angle. Calculations were performed using Maple 10™ symbolic processing software (Waterloo, Inc). Reference is also made to *Ferroelectric Polymers*, T. T Wang, J. M. Herbert, and A. M. Glass, Eds., Chapman and Hall, NY, (1988) (particularly Chapters 3, 4, 5, and 12) with regards to piezoelectric material properties, film preparation, etc.

The model described is based on isotropic layers having the same refractive index in each direction. In reality, the films will be birefringent. The model is still accurate for $E_s$ incident waves as these only depend on the in-plane refractive indices oriented "out of the page" as shown in FIG. 1. In contrast, $E_p$ waves depend on both the in-plane and through-the-thickness refractive indices which the above model cannot adequately handle. As a result, the examples below will only focus on the $E_s$ waves, although it is understood that some unusual optics can be obtained by matching (or not matching) refractive indices in the thickness direction so as to control internal reflection and thereby broaden the angular window for the films.

For the calculations, the film is assumed to be free standing in air (n=1) so both the substrate refractive index $n_s$, and the incident medium $n_m$, are equal to 1. For the case where these films are coated, or laminated to a substrate (as would normally be the case), these values would need to be modified accordingly.

Comparative Example 1

Traditional Microcoextruded Film

In this prophetic example, an $(A/B)^{25}$ layer film is produced where the A layer is PEN, and the B layer is PMMA. This structure is very similar to many commercially available iridescent packaging films on the market today. In contrast to the commercial films, however, an electrode is metallized on the top and bottom surfaces. The layers are constructed such that each is nominally $n\lambda/4$ where n is an odd number (e.g., 1, 3, 5 . . . etc.) and $\lambda$ is the target wavelength in the material thereby resulting in a film with very high total reflectance at that wavelength. Note again that $\lambda$ is the wavelength in the material corresponding to $\lambda_o$ which is the wavelength in air or vacuum. For most of these examples, we will assume $\lambda_o$=500 nm. Neither polymer is piezoelectric so application of an electric field does not cause any changes in the reflectivity. Thus this structure is not dynamic, and cannot be used in voltage controlled optical modulation applications.

Example 1

Processing of a PVDF/Copolyester Coextruded Film

In this example, a film containing alternating layers of Eastman PETG copolyester and Dyneon™ PVDF was prepared. A special microcoextrusion die was not available so a 5-layer coextrusion die was used to demonstrate the concept. In this structure, the 5 layers contained PETG/PVDF/PETG/PVDF/PETG (A/B/C/B/A structure) in approximate thickness ratios of 12.5%/25%/25%/25%/12.5%. This was done so that the films could be stacked/laminated, if desired.

Both resins were dried prior to extrusion for 4 hrs at 150° F. using forced air dessicant dryers. Extrusion was performed using 1" Killion extruders (24:1 general purpose screw) for each of the A, B, and C components. The processing temperature was nominally 240° C. for all three extruders. Screw speeds were nominally 10 to 15 RPM. Film was extruded onto a chill-roll having a nominal thickness of 3 to 4 mils (70 to 100 μm) and wound for later stretching. The film appeared to have good clarity and adhesion between layers in its as-cast form.

After casting, the film was then biaxially stretched using a T.M. Long film stretcher. Samples that were 2 inches by 2 inches square were cut from the cast film, and stretched either 4×4 or 4.5×4.5× to give films having a final thickness of from 4 to 5 microns. Average layer thickness for each material was nominally about 1 micron.

Even though the films only had 5 layers, they still showed the characteristic red/green color shifting typical of iridescent films although to a much lesser extent. Otherwise, the films had excellent clarity and feel. Layer adhesion was also good and all data indicated that there should be no problems in scaling up such a structure to more layers and a larger line with the appropriate coextrusion equipment.

Example 2

Poling of the Film

A piece of the oriented film in Example 1 was poled by mounting between electrodes (the "electrodes" were of a volume resistivity test measuring cell which had plates roughly 2 inches in diameter) and placing in an oven at 85° C. A voltage of 1000V was applied across the film using a source measurement-type source resulting in a field strength of approximately 55 V/micron. The film was poled for 2 hours at 85° C., then the oven was turned off such that the film was allowed to cool slowly back to room temperature. Upon reaching room temperature (about 2 hours later), the voltage was removed and the film shorted across to eliminate any residual charges.

To determine whether the poling was effective, a sample of poled film was coated on each side with a conductive paint available from Radio Shack, to which electrodes were connected and an oscilloscope attached. The film was then stressed/deformed while the voltage output of the film was monitored to determine whether piezoelectric effect was present. A voltage was indeed detectable confirming that the PVDF layers were piezoelectrically active. This experiment did confirm that the microcoextrusion structure could be produced.

Example 3

Dynamic Reflecting Film Using a Piezoelectric Polymer

In this prophetic example, an $(A/B)^{10}$ layer film is constructed with the A layer being PVDF, and the B layer being PET. A metallized electrode is applied to the top and bottom surfaces. The film is made by traditional micro-coextrusion technology. The PET pellets are dried for 4 hours at 150° C. prior to extrusion in order to remove moisture. They are then melt extruded at a nominal 280° C. before being piped into the coextrusion feedblock. The PET is cooled to about 240° C. before entering the feedblock in order to maintain uniform temperature.

The PVDF is melt processed at 220° C. in an extruder, and then heated to 240° C. as it is pumped into the feedblock. There, the layers are combined and folded until the 20 total alternating layers are produced. The layers are combined such that the PET layers are approximately 1.2 microns thick, and the PVDF is approximately 29 microns thick resulting in a total nominal thickness of about 300 microns.

After casting, the film is then stretched on a tenter frame at 100° C., approximately 4× in each direction (16× thickness reduction) reducing the layers to 0.075 and 1.8 microns, respectively. These correspond approximately to the $\lambda/4$ and $21\lambda/4$ thicknesses assuming an in-plane refractive index of 1.65 and 1.45 for PET and PVDF, respectively, and an incident wavelength $\lambda_o$ of 0.5 microns (in the middle of the visible spectrum). These numbers are approximate and can vary depending on processing conditions, but are reasonable for these calculations. The total final thickness of the film is 19 microns.

After stretching, the film is heatset at 150° C. in the tenter frame to reduce the tendency for shrinkage, and then wound. Next, the film is electrically poled with an electric field of about 80 MV/m at a temperature of 120° C. Proper heatsetting of the film should alleviate any tendency towards shrinkage at this step. The PET is essentially unaffected by the poling, which is performed for about 30 minutes. As a result of the poling, the PVDF dipoles will align such that the positive end of the dipole will orient towards the negative terminal of the poling source. Upon completion, the film is piezoelectrically active and the effective $d_{33}$ of the piezoelectric is approximately $30 \times 10^{-12}$ m/V.

The resulting film is highly reflective in its natural state (i.e., no applied voltage). To change this, an electrode is placed on the top and bottom surfaces of the film via metallization. The electrodes, in turn, are connected to a voltage source. When the polarity of the applied voltage is the same as the dipole polarity, the piezoelectric layers will contract. A reversal of polarity will cause it to expand. For this example, the voltage is aligned so as to cause a contraction in order to drive the piezoelectric film towards its $20\lambda/4$ transmissive thickness.

Figure 2:
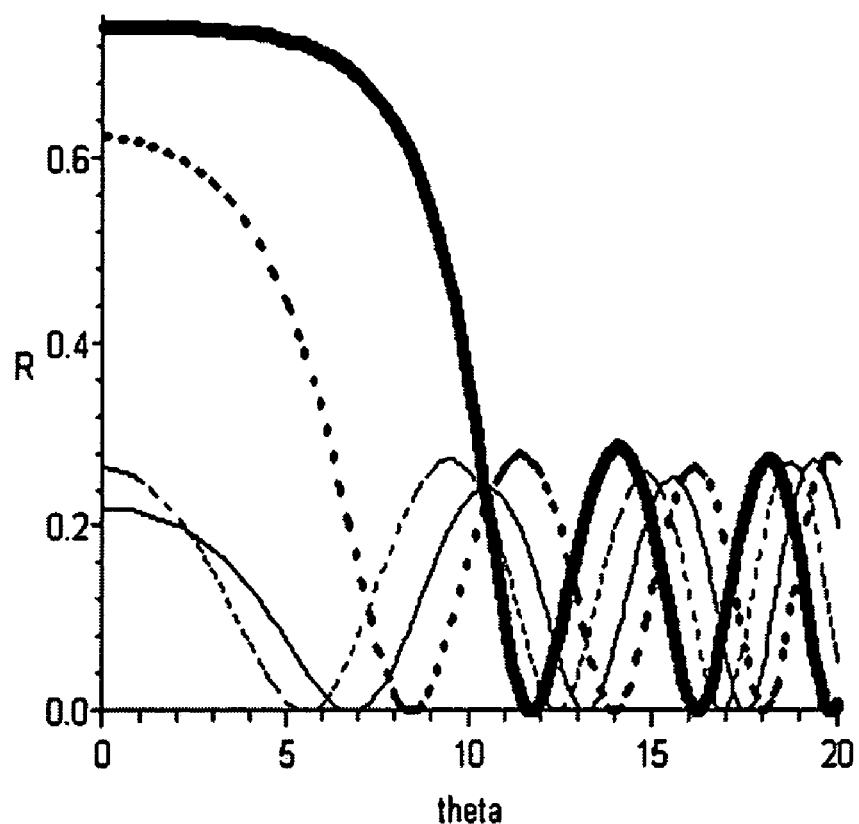
FIG. 2 is a graph of reflectance (R) versus incidence angle theta for different applied voltages ($E_s$ wave) for a 20 layer structure based on PVDF.
Figure 2:
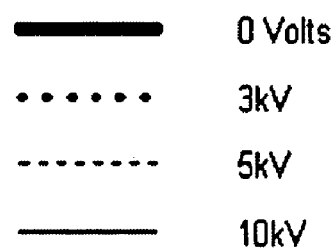

The strain needed to convert the film fully from $21\lambda/4$ thickness to $20\lambda/4$ thickness is about 0.047 or 4.7%. This corresponds to an instantaneous E field of about 1.57 kV/micron. For a 19-micron total thickness, the applied voltage needs to be 29.7 kV to achieve this E field. This is probably too high to be practical as dielectric breakdown can occur. For example, thin biaxially oriented PET is known to have a dielectric breakdown strength of about 15000 V/mil (590 V/micron) whereas PVDF is approximately 200 V/micron. Fortunately, however, the transition from reflection to transmission will occur at lower voltages. This is illustrated in FIG. 2 for the Es wave (incident wavelength assumed to be 0.5 microns), where the reflectivity R is plotted as a function of incident angle for different applied voltages. Even as low as 3 kV, the reflectivity drops significantly from about 0.8 to 0.6. At 5 kV, the reflectivity has dropped to about 0.2 (25%).

Note that these voltages are "instantaneous DC values" at a given instant in time. In reality, the voltage applied will need to be alternating (e.g., sinusoidal AC, squarewave, etc.) to prevent dipolar relaxation of the piezoelectric. The true reflection seen by an observer will thus be the average over the full cycle of the applied voltage, and thus will depend on frequency, waveform shape, and duty cycle (e.g., a low frequency will exhibit "flickering"). Regardless of the waveshape, these sorts of voltages are reasonable and can be achieved using an appropriate AC source (and/or transformer), or a DC source (e.g., a battery) connected to a properly designed inverter such as those used to power portable fluorescent light bulbs.

FIG. 2 also illustrates the reflectivity change as a function of incidence angle. With no voltage applied, the material has a high reflectivity R of 0.8 (or 80%) over an angle from 0 degrees (normal incidence) to about 10 degrees in either direction. This is a net 20 degree viewing angle over which the film would be useful. This viewing angle can be increased by decreasing the thickness of the layers (i.e., lower order thicknesses) or by increasing the number of layers. The numbers and thicknesses of layers are interrelated in that higher voltages may be required if the film is not properly designed.

Finally, this film could be used in a "reflective" mode by mounting it to a mirrored surface. Thus, light would have to pass through the film twice, thereby doubling the effective thickness. Regardless of the use, the film in this example can be turned on and off via an applied voltage.

Example 4

A Normally Reflective Film with Fewer Layers Requiring Lower Voltage

This prophetic example is identical to Example 3, except that it is optimized to reduce the voltage required. By decreasing the number of layers from 20 to 15, and otherwise keeping the structure the same, the total thickness of the film is reduced to 14.2 microns. This in turn reduces the applied voltage required for a given E field by about 25% with minimal loss in film performance.

Example 5

A Normally Reflective Film Using an Improved Piezoelectric Layer from VDF-TrFE

This prophetic example is identical to Example 4, except that it uses a higher performance piezoelectric. PVDF typically has a value of $d_{33}$ of about $30 \times 10^{-12}$ m/V under nominal conditions. However, copolymers of vinylidene fluoride (VDF) and trifluoroethylene (TrFE) are known to have much higher $d_{33}$ values (see p. 102 of *Ferroelectric Polymers*). Estimates of $d_{33}$ for a 65/35 (mol/mol) VDF/TrFE copolymer are as high as about 150e-12 m/V. Using this copolymer in the 15 layer structure of Example 4, and assuming all other factors are the same, we find that we can achieve the same decrease in reflectance, but at a much lower voltage of about 500V (see FIG. 3).

Example 6

A Normally Transmissive Film

Figure 4:
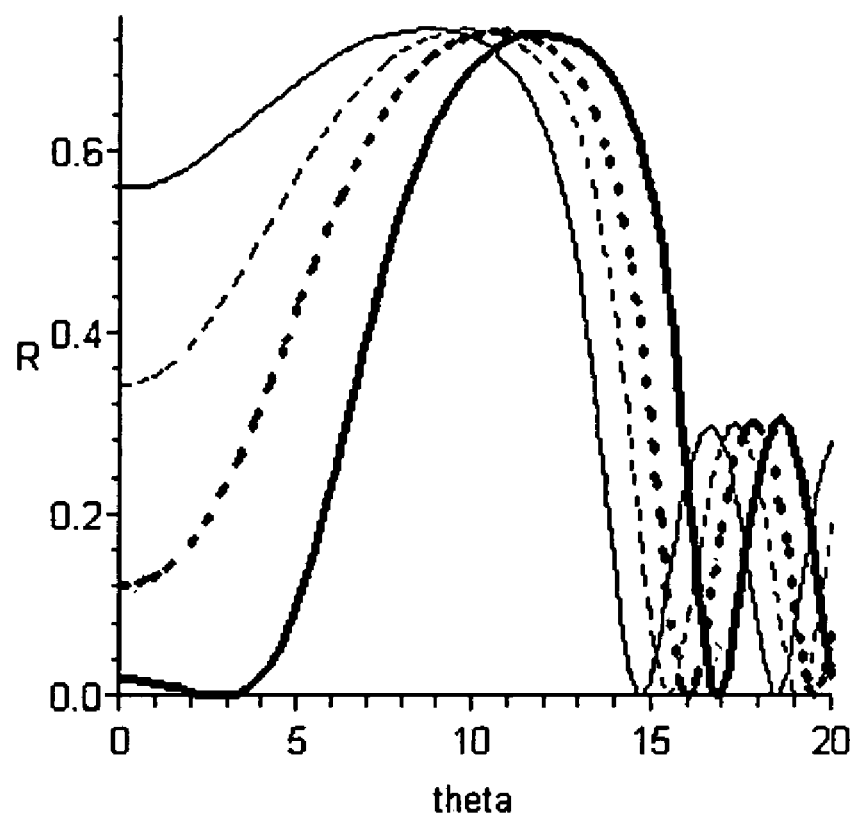
FIG. 4 is a graph of reflectance (R) versus incidence angle theta for different applied voltages for a film that is normally transmissive with no applied voltage.
Figure 5:
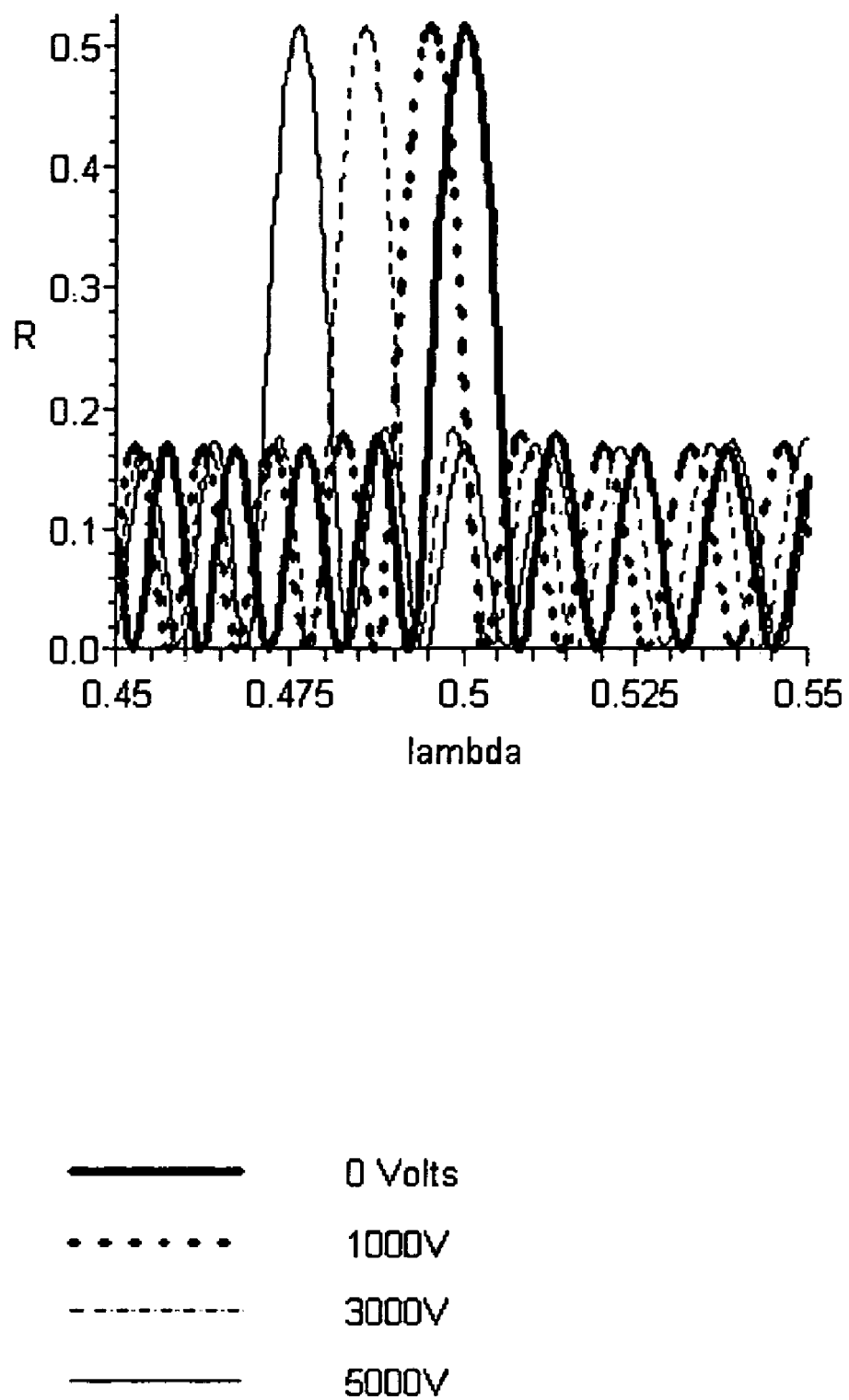
FIG. 5 is a graph showing the effect of wavelength on reflection ($E_s$ wave).

This film is the same as in Example 4, except that the piezoelectric layer is designed to be slightly thicker than $21\lambda/4$ after stretching, and the PET layer is $\lambda/4$. For example, the film PVDF layer thickness for $21\lambda/4$ thickness is 1.81 microns. For the structure of this example, however, the initial thickness for the PVDF layer will be assumed to be 1.83 microns, which is just slightly outside of the reflective range. With no applied voltage, the film is transmissive. However, application of a voltage causes it to reflect as illustrated in FIG. 4. As observed over a viewing angle from about 0 to 5 degrees, the reflection coefficient increases almost linearly as the voltage increases. This is the opposite of the film in the previous examples. Such a film would work nicely as, for example, an electrically controlled window shade or dimmer. Note that the voltage ranges for this film could be further reduced via the same manner as described in Examples 5 and 6 (e.g., fewer layers or use of PVF-TrFE) if so desired.

Example 7

Color Change Via an Applied Voltage

Figure 3:
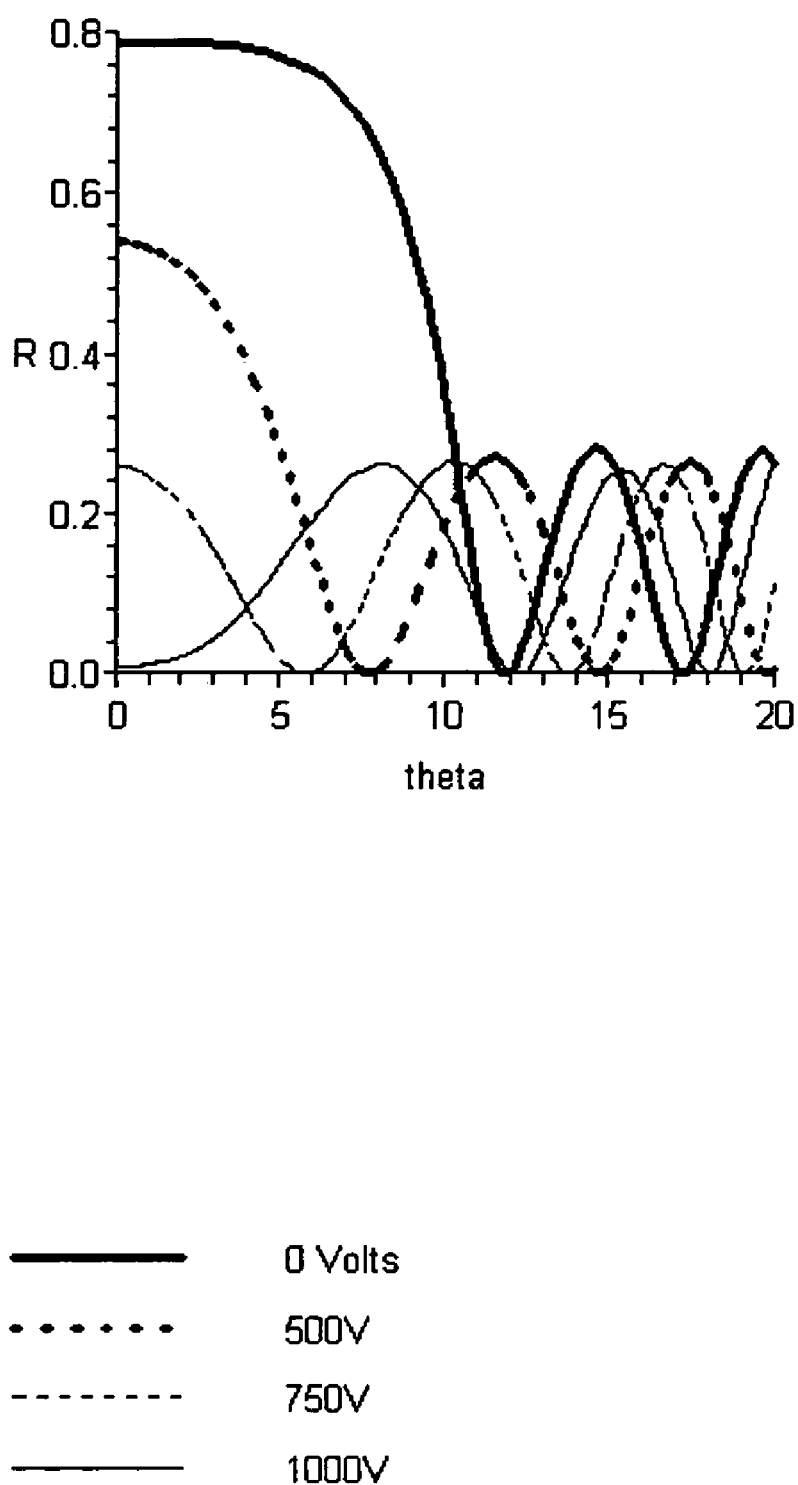
FIG. 3 is a graph of reflectance (R) versus incidence angle theta for different applied voltages ($E_s$ wave) for a 15 layer structure based on a PVF/TrFE copolymer.

This film is the same as in Example 5, except the reflectivity versus wavelength is analyzed and the piezoelectric layer is designed with a thickness of $11\lambda/4$ (0.95 microns). This thinner layer structure has been chosen to provide better bandwidth control with regards to color shifting. Previous examples focused on monochromatic light at 0.5 microns, which is in the center of the visible band. FIG. 3 shows a plot of the reflectivity as a function of wavelength for different applied voltages. All calculations are at a 0 degree incident angle.

With no applied voltage, the reflectivity is a maximum at $\lambda_o = 0.5$ microns (i.e., green) as this was the design point. As the voltage increases, the reflection shifts to lower wavelengths, causing green and then blue wavelengths to be reflected. Further voltage increase will result in violets and then ultraviolets being reflected. If the voltage polarity is reversed, the piezoelectric layer will expand and reflection will shift towards the red end of the spectrum. Note that with an AC voltage, the perceived color will be an average relative to the voltage as a function of time, since it will be shifting the reflection both positively and negatively. The actual shape and/or duty cycle of the voltage form could thus be manipulated to further alter the perceived color. Furthermore, while the film of the present example exhibits controlled color reflection, it simultaneously transmits the other wavelengths. So, for example, if the film was backlit with white light, it could be used to display different colors by shifting the applied voltage.

Example 7

Addition of a Tie or Glue Layer

To enhance the adhesion between layers, a glue or tie layer is often used. In this prophetic example, an $(A/T/B/T)^{12}$ structure is made where A is the PVDF, B is PET, and T is a tie layer. There are many tie layers that incorporate reactive chemistries (e.g., maleic anhydride, glycidyl methacrylate (GMA), epoxide, etc. and most of these are in an olefin base, such as a polyethylene based material). For this example, we will use a glycidyl methacrylate modified olefin such as Lotader 8900 (Atofina), which has good adhesion with PET. It is extruded in a separate extruder and brought together into the desired structure before "folding" into the many layers. Most of these olefin-based tie layers have refractive indices similar to PVDF so they effectively thicken the PVDF layer. Nevertheless, the thickness changing portion is related only to the PVDF portion. The structure is assumed to have a PVDF thickness of $19\lambda/4$, and each tie layer is designed to be $\lambda/4$. Thus, the total effective thickness of the structure is $21\lambda/4$ as in Example 3. This film should perform almost identically to the film in Example 3 except that slightly higher voltages will be required (since the tie layer is not piezoelectrically active) and the adhesion will be better.

The use of tie layers can also be incorporated into the structures in the examples above in an analogous manner. In the event the tie layer does not match up with the A or B polymer refractive index, then a full calculation is required (but the structures will still be useful). Such a mismatched structure may be desirable for some applications where, for example, improved reflection over broader viewing angles is required.

Obviously, other variations of this example can also be envisioned depending on the desired optical properties.

Example 8

Dynamic Polarizing Film that can be Turned On or Off

In this prophetic example, the $(A/B)^{15}$ structure is made similar to Example 3, except that it is uniaxially oriented 4× instead of being biaxially oriented. The refractive index for PET will nominally be 1.65 in the stretch direction, and 1.55 in the transverse direction. The PVDF is assumed to be 1.45 in the stretch direction and 1.42 in the non-stretch direction.

Layer thicknesses after stretching are designed to be $21\lambda/4$ (0.181 microns) for the PET and PVDF layers based on the oriented direction and a 0.5 micron monochromatic light source. In the transverse direction, these thicknesses will not match the reflection criterion, nor will the reflectivity be high since the refractive index difference is lower, so the film is not expected to be reflective to light waves polarized in this direction.

Calculations for the reflection values are performed as before for the $E_s$ wave, except they have to be performed for both the stretch and transverse directions using the appropriate refractive indices. For light waves polarized in the stretch direction, the reflection curve will be identical to that shown in FIG. 2 for 0.5 micron incident light. For the transverse direction, however, the material is essentially transmissive at all voltages as the reflectivity remains below 0.3 for all theta and voltage levels.

The net result of this is that wavelengths parallel to the stretch direction can be selectively blocked or transmitted by changing voltage, whereas the wavelengths oriented along the transverse direction will always pass through. Thus, this is essentially a polarizer that can be turned on and off simply by applying and removing a voltage.

Example 9

Application as a Display

In this prophetic example, the film from Example 5 is used to make a monochromatic display. The electrode on the surface is replaced with a clear ITO substrate in a grid similar to that used in traditional LCDs. The film is backlit with a light source at or near 0.5 microns. However, with no voltage applied, the film is reflective and this source cannot be seen. To display a digit or other graphic symbol, the appropriate electrode is energized with an applied voltage. This turns off the reflection and allows the backlighting source to be visible at that location. It is preferred that the voltage be applied in pulses at 10 Hz or higher so as to eliminate dipole decay in the film. Persistance of vision will make the display appear to be constant and the allowable viewing angle (+/−10 degrees).

This structure has all of the capabilities of a standard monochrome LCD, but is cheaper and flexible, and does not require polarizers or liquid crystal polymers. For the current structure higher driving voltages are required so care will have to be taken in ITO electrode layout (to prevent arcing), but larger panels/pixels, improved piezoelectric materials and/or design optimization could bring voltages more in line with, for example, plasma display systems.

Example 10

Multicolor Display

This prophetic example is similar to Example 9, except that multiple colors can be viewed. The film is built as before, except the backlighting is white. As shown in Example 7, the color that is transmitted (or reflected) can be varied by changing the voltage level. At 0 volts, the display shows all colors except those around 0.5 microns (yellow-green). At higher voltage, colors are reflected at the shorter wavelengths (blues, violets) whereas if the voltage polarity is reversed, the long wavelengths become visible (reds, oranges).

Refinements in the structure can be made to improve the color control and resolution. Alternatively, instead of relying on transmission from backlighting, a reflection from forward lighting could be used for narrower color control. For colors like pure white, the voltage would need to be high enough that it only reflects in the UV or IR region so that the full backlighting is transmitted through.

The invention has been described in detail with particular reference to preferred embodiments thereof, but it will be understood that variations and modifications can be effected within the spirit and scope of the invention.

I claim:

1. A multilayer film comprising 5 or more total layers and at least 3 piezoelectric layers in which said piezoelectric layers are each separated by one or more intervening substantially transparent polymer layers, wherein said piezoelectric layers comprise a polymer selected from the group consisting of poly(vinylidene fluoride), poly(vinyl fluoride), aromatic polyamide, polysulfone, cyanoethyl cellulose, polyvinylidene chloride, polyparaxylene and copolymers thereof, and wherein the film is a coextruded film.

2. The film according to claim 1, which comprises from 10 to 1000 total piezoelectric and intervening layers.

3. The film according to claim 1, wherein said piezoelectric layers comprise poly(vinylidene fluoride) or copolymers of poly(vinylidene fluoride) and trifluoroethylene.

4. The film according to claim 1, wherein each of said intervening layers are the same or different.

5. The film according to claim 4, wherein said one or more non-piezoelectric layers comprise a polymer selected from the group consisting of polyalkylene naphthalate, polyalkylene terephthalate, polycarbonate, polyarylate, polyamide, polyimide, polyamide-imide, polyether-amide, polyetherimide, polyaryl ether, polyarylether ketone, aliphatic polyketone, polyphenylene sulfide, polysulfone, polystyrene, polyacrylate, polymethacrylate, cellulose derivative, polyalkylene, ionomeric resin, elastomer, silicone resin, epoxy resin, and polyurethane.

6. The film according to claim 4, wherein said one or more non-piezoelectric layers comprise a polymer selected from the group consisting of polyethylene naphthalate, polyethylene terephthalate, poly(cyclohexylene dimethylene terepthalate), polymethyl methacrylate, polycarbonate, and copolymers thereof.

7. The film according to claim 1, wherein said intervening layers comprise a tie layer.

8. The film according to claim 7, wherein the tie layer comprises monomers selected from the group consisting of maleic anhydride, glycidyl methacrylate, epoxides and mixtures thereof.

9. The film according to claim 1, which further comprises electrodes on the surface thereof.

10. The film according to claim 1, wherein each layer has a thickness of 0.05 to 5 microns.

11. The film according to claim 1, which further comprises one or more polarizing layers.

* * * * *